United States Patent
Park

(10) Patent No.: US 7,257,027 B2
(45) Date of Patent: Aug. 14, 2007

(54) NON-VOLATILE MEMORY DEVICE, AND MULTI-PAGE PROGRAM, READ AND COPYBACK PROGRAM METHOD THEREOF

(75) Inventor: Jin Su Park, Daegu-si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 0 days.

(21) Appl. No.: 11/295,887

(22) Filed: Dec. 6, 2005

(65) Prior Publication Data

US 2007/0002621 A1    Jan. 4, 2007

(30) Foreign Application Priority Data

Jun. 30, 2005    (KR) .................. 10-2005-0057830

(51) Int. Cl.
G11C 11/34    (2006.01)
G11C 16/04    (2006.01)

(52) U.S. Cl. ................. 365/185.11; 365/185.12; 365/185.17; 365/185.25

(58) Field of Classification Search .......... 365/185.11, 365/185.12, 185.17, 185.25
See application file for complete search history.

(56) References Cited

U.S. PATENT DOCUMENTS 6,614,715 B2 * 9/2003 Tsao et al. ............... 365/238.5
7,149,120 B2 * 12/2006 Lee et al. .............. 365/185.22
2004/0027881 A1 2/2004 Furukawa

* cited by examiner

Primary Examiner—Richard T. Elms
Assistant Examiner—Toan Le
(74) Attorney, Agent, or Firm—Townsend and Townsend and Crew LLP

(57) ABSTRACT

A NAND-type flash memory device has a multi-plane structure. Page buffers are divided into even page buffers and odd page buffers and are driven at the same time. Cells connected to even bit lines within one page and cell connected to odd bit lines within one page are programmed, read and copyback programmed at the same time.

16 Claims, 8 Drawing Sheets

NON-VOLATILE MEMORY DEVICE, AND MULTI-PAGE PROGRAM, READ AND COPYBACK PROGRAM METHOD THEREOF

BACKGROUND

1. Field of the Invention

The present invention relates to non-volatile memory devices, and multi-page program, read and copyback program method thereof. More specifically, the present invention relates to non-volatile memory devices having a multi-plane structure, and multi-page program, read and copyback program method thereof.

2. Discussion of Related Art

In the case of NAND-type flash memory devices, the program speed is very slow, i.e., about several hundreds of μs. To improve the program throughput becomes an important parameter representing the performance of chips. In order to enhance the program throughput, various program operation methods such as a cache program and a multi-page program have been proposed. In the case of the cache program, while data are programmed into a cell, next data are previously stored in a page buffer. The cache program method has, however, a lower efficiency as the program time of the cell is higher than the data input time.

FIG. 1 is a block diagram of a conventional NAND-type flash memory device that performs a multi-page program operation in the multi-plane structure.

Referring to FIG. 1, the NAND-type flash memory device includes N number of planes PN<0> to PN<n>. Each of the planes PN<0> to PN<n> has J number of memory cell blocks MB<0> to MB<j>. Each of the memory cell blocks MB<0> to MB<j> has M number of pagers PG<0> to PG<m>, which are controlled by M number of word lines WL0 to WLm, respectively.

In FIG. 1, to K number of page buffers PB<0> to PB<k> in each of the planes PN<0> to PN<n> are sequentially input K number of data. After the data are sequentially input, a program operation (①) and a program verify operation (②) are performed on only even memory cells (or odd memory cells connected to odd bit lines BLo), which are connected to one word line (e.g., WL1) within the planes PN<0> to PN<n> and to even bit lines BLe during a program time.

FIG. 2 shows one plane structure in FIG. 1.

Referring to FIG. 2, one word line (e.g., WL1) is connected to the gates of cells MC1 connected to the even bit line BLe and cells MC1' connected to the odd bit line BLo. One page buffer (e.g., PB<0>) is connected to the even bit line BLe and the odd bit line BLo through a sensing line SO. The page buffer (e.g., PB<0>) is connected to the even bit line BLe when an even bit line select signal BSLe is activated, and is connected to the odd bit line BLo when an odd bit line select signal BSLo is activated.

This NAND-type flash memory device employs a bit line shielding scheme in which the even bit line BLe and the odd bit line BLo are divided in order to prevent a read fail incurred by bit line coupling. The bit line shielding scheme uses the odd bit line BLo as a shielding bit line when reading a memory cell connected to the even bit line BLe.

In the multi-page program method of the NAND-type flash memory device having the above-described N-plane structure, however, data can be programmed into only the memory cells MC1 (or cells MC1' connected to BLe), which are connected to the even bit line BLe within the page PG<1> selected by one word line (for example, WL1).

SUMMARY OF THE INVENTION

An advantage of the present invention is a NAND-type flash memory device having a multi-plane structure, in which cells connected to an even bit line within one page and memory cells connected to an odd bit line can be programmed, read, and copyback programmed at the same time.

According to one embodiment of the present invention, a non-volatile memory device includes a cell array having memory cells respectively connected to word lines and bit lines, a plurality of even page buffers respectively connected to even bit lines of the bit lines through even sensing lines, and a plurality of odd page buffers respectively connected to odd bit lines of the bit lines through odd sensing lines separated from the even sensing lines. In this case, the plurality of even page buffers and the plurality of odd page buffers sequentially receives data to be programmed and programs the data into even memory cells and odd memory cells connected to one word line of the word lines at the same time.

According to another embodiment of the present invention, a multi-page program method of a non-volatile memory device having a cell array consisting of memory cells respectively connected to word lines and bit lines includes the steps of sequentially storing data to be programmed in a plurality of even page buffers respectively connected to even bit lines of the bit lines through even sensing lines, respectively, and a plurality of odd page buffers respectively connected to odd bit lines of the bit lines through the odd sensing lines, respectively, which are separated from the even sensing lines, and simultaneously programming the data to be programmed, which are stored in the plurality of even and odd page buffers, respectively, into even memory cells and odd memory cells connected to one word line of the word lines.

According to still another embodiment of the present invention, a multi-page read method of a non-volatile memory device having a cell array consisting of memory cells respectively connected to word lines and bit lines includes the steps of precharging odd bit lines, thus making the odd bit lines shielding bit lines, reading data programmed into even memory cells connected to one word line and storing the data into each of a plurality of even page buffers, precharging the even bit lines that have been sensed, thus making the even bit lines shielding bit lines, reading data programmed into odd memory cells connected to the one word line and storing the data in each of a plurality of odd page buffers, and sequentially reading the data stored in each of the plurality of even and odd page buffers toward the outside.

According to still another embodiment of the present invention, a multi-page copyback program method of a non-volatile memory device having a cell array consisting of memory cells respectively connected to word lines and bit lines includes the steps of precharging each of odd bit lines of the bit lines, thus making the odd bit lines shielding bit lines, reading data programmed into even memory cells connected to one word line of the word lines and storing the read data in each of a plurality of even page buffers respectively connected to even bit lines of the bit lines through even sensing lines, precharging each of the even bit lines, thus making the even bit lines shielding bit lines, reading data programmed into odd memory cells connected to the one word line and storing the read data in a plurality of odd page buffers respectively connected to the odd bit line through each of odd sensing lines separated from the even sensing lines, and copyback programming the data stored in each of the plurality of even page buffers and the data stored in each of the plurality of odd page buffers into even memory cells and odd memory cells connected to the other word line of the word lines.

DETAILED DESCRIPTION OF PREFERRED EMBODIMENTS

Embodiments according to the present invention will be described with reference to the accompanying drawings. Since these embodiments are provided for the purpose that those ordinary skilled in the art are able to understand the present invention, the embodiments may be modified in various manners so that the scope of the present invention is not limited by the embodiments described later.

Figure 1:
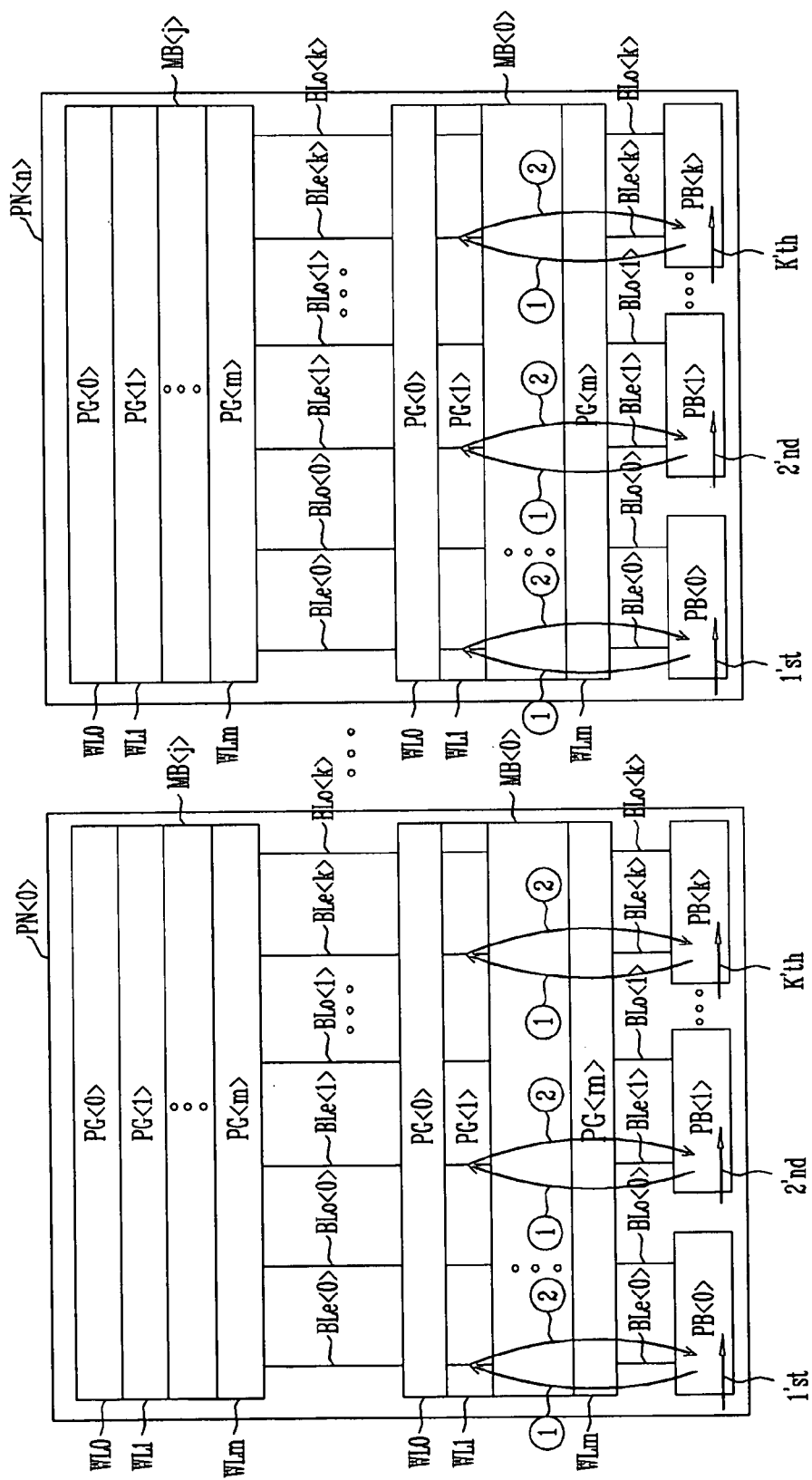
FIG. 1 is a block diagram of a NAND-type flash memory device having an existing multi-plane structure.
Figure 2:
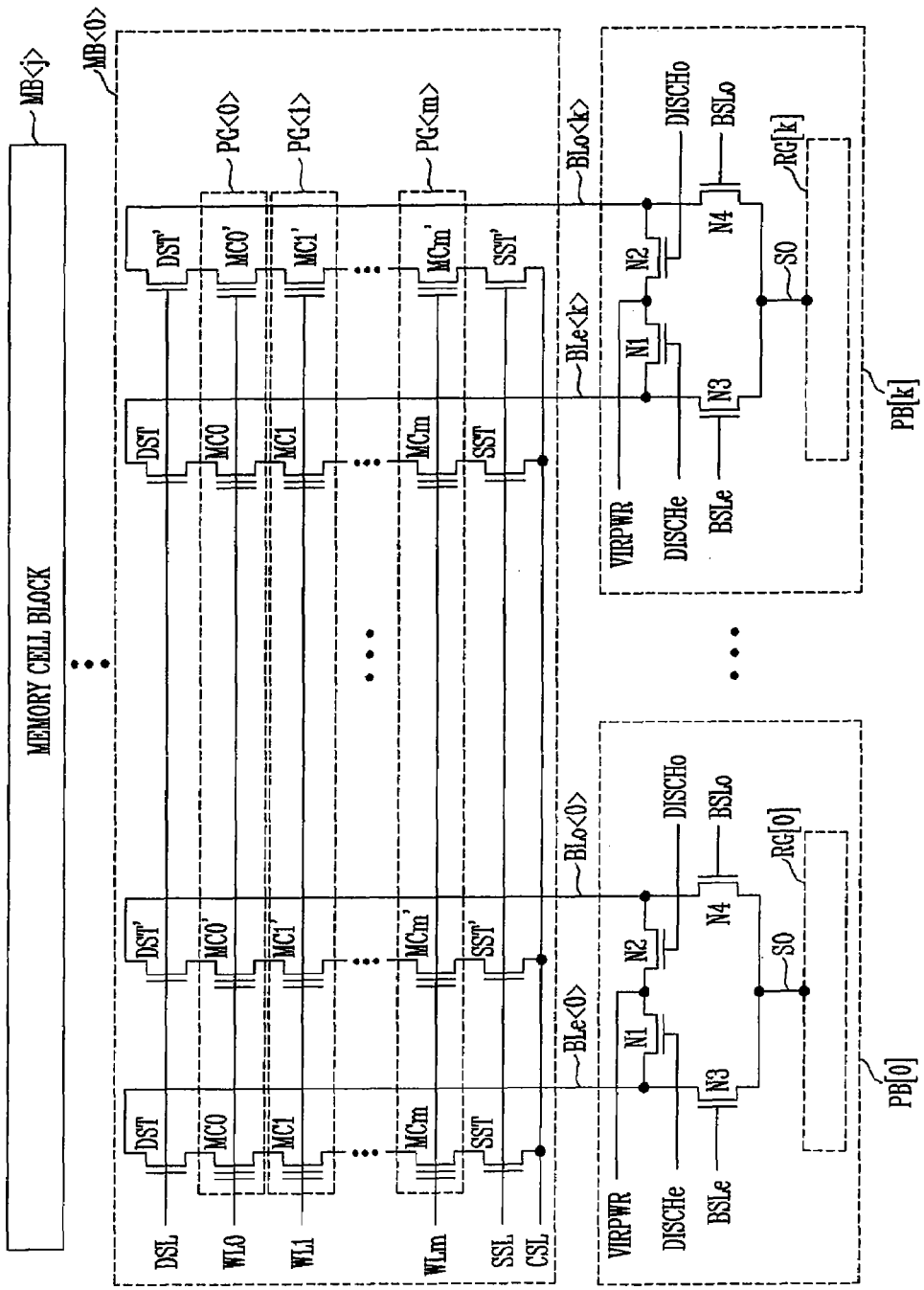
FIG. 2 is a circuit diagram of one plane structure shown in FIG. 1.
Figure 3:
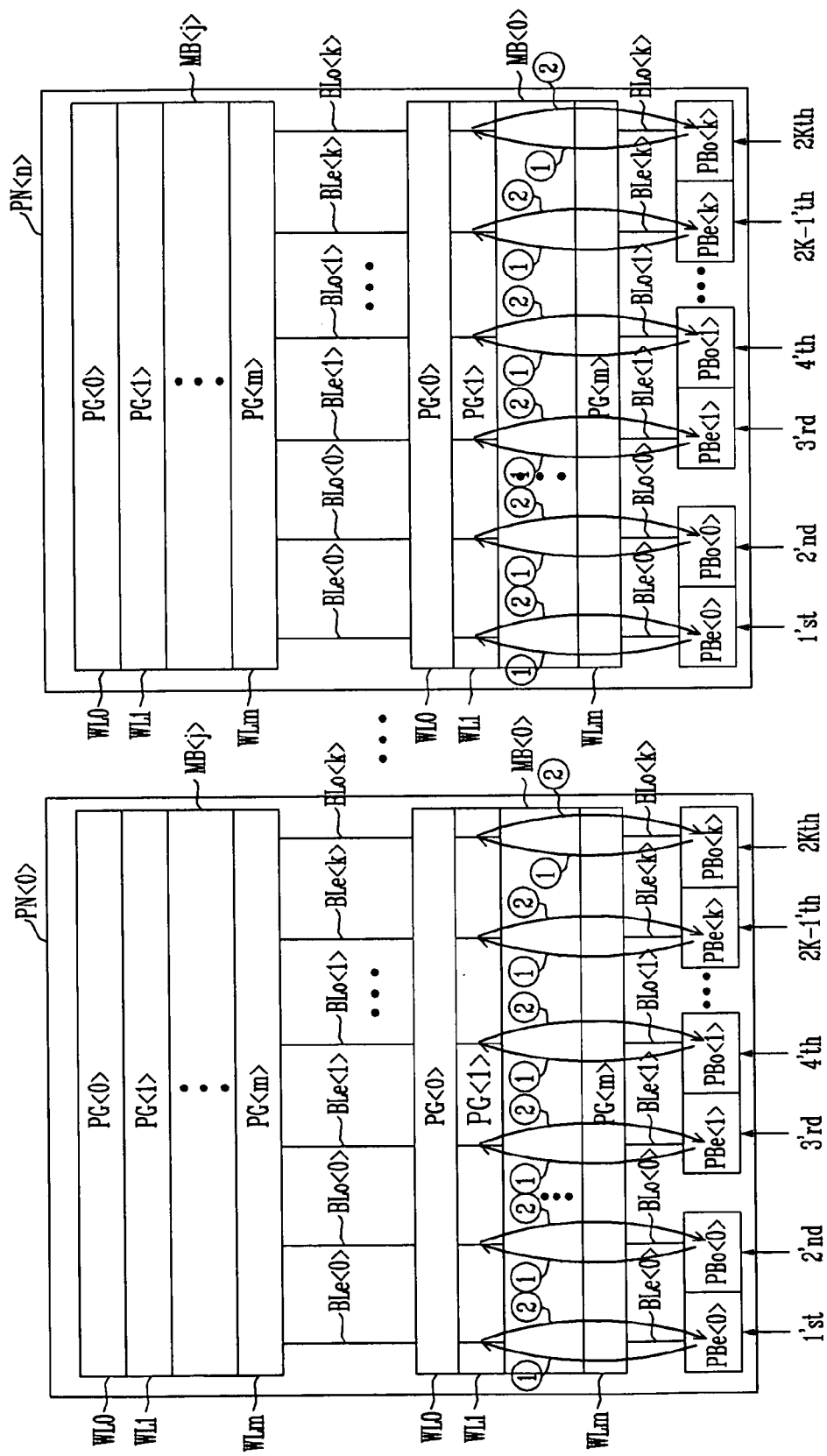
FIG. 3 is a block diagram of a NAND-type flash memory device having a multi-plane structure according to one embodiment of the present invention.

FIG. 3 is a block diagram of a NAND-type flash memory device having a multi-plane structure according to an embodiment of the present invention.

Referring to FIG. 3, the NAND-type flash memory device includes N number of planes PN<0> to PN<n>. Each of the planes PN<0> to PN<n> has J number of memory cell blocks MB<0> to MB<j>. Each of the memory cell blocks MB<0> to MB<j> includes M number of pagers PG<0> to PG<m>, which are controlled by M number of word lines WL0 to WLm, respectively.

As shown in FIG. 3, 2K number of page buffers PBe<0> to PBe<k> and PBo<0> to PBo<k> exist in each of the planes PN<0> to PN<n>. Two 2K number of page buffers PBe<0> to PBe<k> and PBo<0> to PBo<k> are sequentially input as data. After the data are sequentially input, the 2K number of page buffers PBe<0> to PBe<k> and PBo<0> to PBo<k> existing in each of the planes PN<0> to PN<n> perform a program operation (①) and a program verify operation (②) during a program time.

Figure 4:
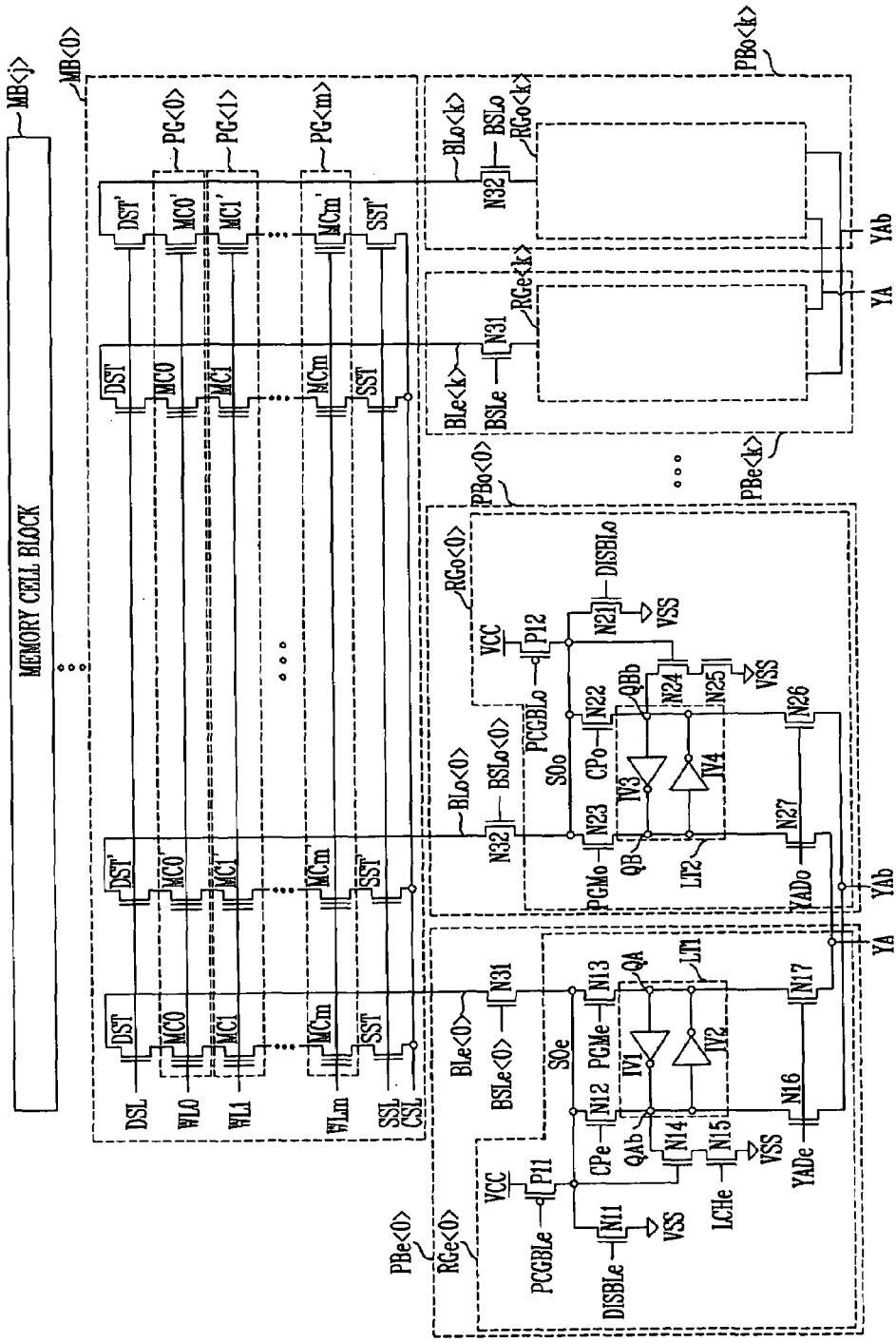
FIG. 4 is a circuit diagram of one plane structure shown in FIG. 3.

FIG. 4 is a detailed circuit diagram of one plane structure in the NAND-type flash memory device having the multi-plane structure according to an embodiment of the present invention.

Referring to FIG. 4, one plane structure includes J number of memory cell blocks MB<0> to MB<j> and 2K number of page buffers PBe<0> to PBe<k> and PBo<0> to PBo<k>.

The memory cells MC0 to MCn are connected to the even bit line BLe. The memory cells MC0' to MCn' are connected to the odd bit line BLo. The even page buffers PBe<0> to PBe<k> are connected to the even bit line BLe according to the even bit line select signal BSLe. The odd page buffers PBo<0> to PBo<k> are connected to the odd bit line BLo according to an odd bit line select signal BSLo. The memory cells MC1, MC1' connected to one word line (e.g., WL1) form one page PG<1>.

Each of the even page buffers PBe<0> to PBe<k> includes an NMOS transistor N31 and an even register RGe. The NMOS transistor N31 serves to connect the even page buffer PBe to the even bit line BLe in response to a bit line select signal BSLe. The even register RGe includes a PMOS transistor P11, NMOS transistors NI1 to N17 and a latch circuit LT1. The PMOS transistor P11 is connected between a power supply voltage VCC and a sensing line SOe, and is turned on/off according to a precharge signal PCGBLe applied to its gate. The latch circuit LT1 consists of inverters IV1 and IV2 and stores data. The NMOS transistor N11 initializes the latch circuit LT1 at the time of an initialization operation, and also makes the even bit line BLe the level of a ground voltage VSS when the even bit line BLe is used as a shielding bit line. The NMOS transistor N12 is turned on according to a copyback signal CPe at the time of a copyback program operation, and transfers data of a node QAb of the latch circuit LT1 to the even bit line BLe. The NMOS transistor N13 is turned on according to a program signal PGMe at the time of a program operation, and transmits data of a node QA of the latch circuit LT1 to the even bit line BLe. The NMOS transistors N14, N15 are connected between the node QAb of the latch circuit LT1 and the ground voltage VSS. The NMOS transistor N14 is turned on/off according to a signal of the sensing line SOe that is applied to its gate. The NMOS transistor N15 is turned on/off according to the latch signal LCHe. The NMOS transistors N16, N17 serve to transfer data to be programmed, which are transmitted through a data line (not shown) from the outside, to the latch circuit LT1 in response to a data I/O signal YADe.

Next, each of the odd page buffers PBo<0> to PBo<k> includes an NMOS transistor N32 and an odd register RGo. The NMOS transistor N32 serves to connect the odd page buffer PBo to the odd bit line BLo in response to the bit line select signal BSLo. The odd register RGo includes a PMOS transistor P12, NMOS transistors N21 and N27 and a latch circuit LT2. The PMOS transistor P12 is connected between the power supply voltage VCC and a sensing line SOo, and is turned on/off according to a precharge signal PCGBLo applied to its gate. The latch circuit LT2 includes inverters IV3, IV4, and stores data. The NMOS transistor N21 serves to initialize the latch circuit LT2 at the time of an initialization operation and also makes the odd bit line BLo the level of the ground voltage VSS when the odd bit line BLo is used as a shielding bit line. The NMOS transistor N22 is turned on according to a copyback signal CPo at the time of the copyback program operation and transmits data of a node QBb of the latch circuit LT2 to the odd bit line BLo. The NMOS transistor N23 is turned on according to a program signal PGMo at the time of the program operation, and transits data of the node QB of the latch circuit LT2 to the odd bit line BLo. The NMOS transistors N24, N25 are connected between the node QBb of the latch circuit LT2 and the ground voltage VSS. The NMOS transistor N24 is turned on/off according to a signal of the sensing line SOo that is applied to its gate. The NMOS transistor N25 is turned on/off according to a latch signal LCHo that is applied to its gate. The NMOS transistors N26, N27 serve to transmit data to be programmed, which are transmitted through a data line (not shown) from the outside, to the latch circuit LT2 in response to a data I/O signal YADo.

Figure 5:
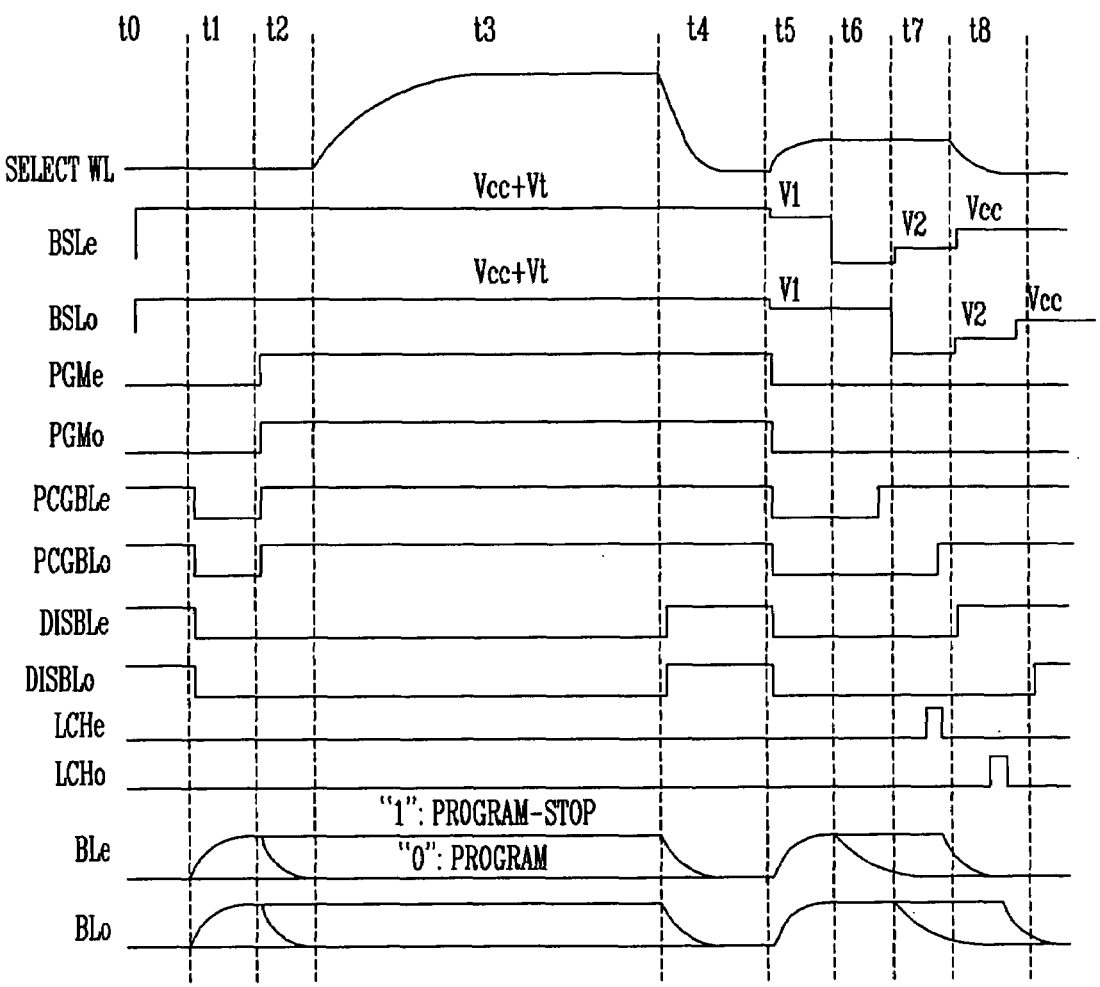
FIG. 5 is a timing diagram showing a method of programming and verifying even cells and odd cells within one page at the same time in FIG. 3.

FIG. 5 is a timing diagram showing program and verify methods in the NAND-type flash memory device having the multi-plane structure according to an embodiment of the present invention.

The method of programming and verifying data into the memory cell MC1 connected to the even bit line BLe within one page PG<1> selected by one word line (e.g., WL1) and the memory cell MC1' connected to the odd bit line BLo will be described in detail with reference to FIGS. 4 and 5.

Although only the even page buffer PBe<0> and the odd page buffer PBo<0> are described in the present invention, it should be considered that the program operation is performed on the remaining even and odd page buffers at the same time.

In the case where data "1" are to be programmed, data "1" are transmitted from a line YA and data "0" are transmitted from a line YAb. In the event that data "0" are to be programmed, data "0" are transmitted from the line YA and data "1" are transmitted form the line YAb. The line YA and the line YAb are connected to a data line (not shown) externally connected.

In the case where data "0" are to be programmed, the NMOS transistors N16, N17 and N26, N27 are turned on according to the data I/O signals YADe, YADo. Therefore, data "0" are stored in the node QA of the latch circuit LT1 and data "1" are stored in the node QAb thereof, and data "0" are stored in the node QB of the latch circuit LT2 and data "1" are stored in the node QBb thereof. In the case where data "1" are to be programmed, data "1" are stored in the node QA of the latch circuit LT1 and data "0" are stored in the node QAb thereof, and data "1" are stored in the node QB of the latch circuit LT2 and data "0" are stored in the node QBb.

In a time period t0, the bit line select signals BSLe, BSLo become the level of VCC+Vt, so that the NMOS transistors N31, N32 are all turned on. Accordingly, the even bit line BLe and the odd bit line BLo are connected to the even page buffer PBe and the odd page buffer PBo through the even sensing line SOe and the odd sensing line SOo, respectively.

In a time period t1, the precharge signals PCGBLe, PCGBLo become logic low and the PMOS transistors P11, P12 are turned on. Accordingly, the sensing lines SOe, SOo and the bit lines BLe, BLo are precharged with the level of VCC.

In a time period t2, the program signals PGMe, PGMo become logic high and the NMOS transistors N13, N23 are turned on at the same time. If so, the even bit line BLe and the odd bit line BLo are kept to a precharge state "1" in the case where data "1" are to be programmed into the memory cell, and become a discharge state "0" in the case where data "0" are to be programmed into the memory cell. That is, the bit lines BLe and the odd bit line BLo are kept to the precharge state "1" when the node QA of the latch circuit LT1 and the node QB of the latch circuit LT2 are "1", and become the discharge state "0" when the node QA of the latch circuit LT1 and the node QB of the latch circuit LT2 are "0".

In a time period t3, if a selected word line (e.g., WL1) is applied with a program voltage, the even memory cell MC1 or the odd memory cell MC1' connected to the selected word line WL1 performs a program or program-prevention operation according to a voltage of the bit lines BLo, BLe.

In a time period t4, the discharge signals DISBLe, DISBLo become logic high and the NMOS transistors N11, N21 are turned on. Accordingly, the bit lines BLe, BLo are discharged with the ground voltage VSS. In this period, since the program signals PGMe, PGMo keep logic high, the NMOS transistors N13, N23 are turned on. Therefore, the node QA of the latch circuit LT1 become "0" and the node QAb thereof become "1", and the node QB of the latch circuit LT2 becomes "0" and the node QBb thereof becomes "1".

After a time period t5, a verify operation for verifying whether the program operation has been successfully performed is carried out.

In a time period t5, the bit line select signals BSLe, BSLo become a voltage V1 and the precharge signals PCGBLe, PCGBLo become logic low, so that the bit lines BLe, BLo are precharged with V1-Vt. In this period, a program verify voltage is applied to the selected word line WL.

In a time period t6, in order to check whether the even memory cells MC1 connected to one word line (e.g., WL1) has been programmed, the bit line select signal BSLe first shifts to logic low, and the NMOS transistor N31 is thus turned off. In this period, if the even memory cells MC1 have been successfully programmed, the even bit line BLe is kept to a precharge state. If the even memory cells MC1 have not yet been fully programmed, the even bit line BLe is discharged. In this period, the odd bit line select signal BSLo continues to keep the voltage V1, and the odd bit line BLo continues to keep the level of V1-Vt. Accordingly, the odd bit line BLo serves as a shielding bit line during the time period t6 where the even bit line BL performs a verify operation, thus removing voltage shift due to coupling between the bit lines.

In a time period t7, the even bit line select signal BSLe is applied with a voltage V2 and the odd bit line select signal BSLe shifts to logic low, so that the NMOS transistor N32 is turned off. In this period, the latch signal LCHe is enabled to logic high and a program verification result is thus stored in the latch circuit LT1. That is, if program on the even memory cells MC1 is successful, the NMOS transistors N14, N15 of FIG. 4 are turned on, so that data "0" are stored in the node QAb of the latch circuit LT1 and data "0" are stored in the node QA thereof. If program on the even memory cells MC1 is unsuccessful, the NMOS transistors N14, N15 are turned off, so that the node QAb of the latch circuit LT1 is kept to "1" and the node QA therefore is kept to an initial state, i.e., "0". In this period, the odd bit line select signal BSLo becomes logic low, and it is checked whether data are successfully programmed into the odd memory cells MC1' of one word line (for example, WL1). If the data are successfully programmed into the odd memory cells MC1', the odd bit line BLo is kept to a precharge state. If the data are not successfully programmed into the odd memory cells MC1', the odd bit line BLo is discharged. The even bit line BLe that have been sensed serve as a shielding bit line.

In a time period t8, since the odd bit line select signal BSLo is applied with the voltage V2 and the latch signal LCHo becomes logic high, a program verification result is stored in the latch circuit LT2. That is, if program into the odd memory cells MC1' is successful, "0" is stored in the node QBb of the latch circuit LT and "1" is stored in the node QB thereof. If program into the odd memory cells MC1' is unsuccessful, the node QBb of the latch circuit LT2 is kept to "1" and the node QB thereof is kept to an initial state, i.e., "0".

Figure 6:
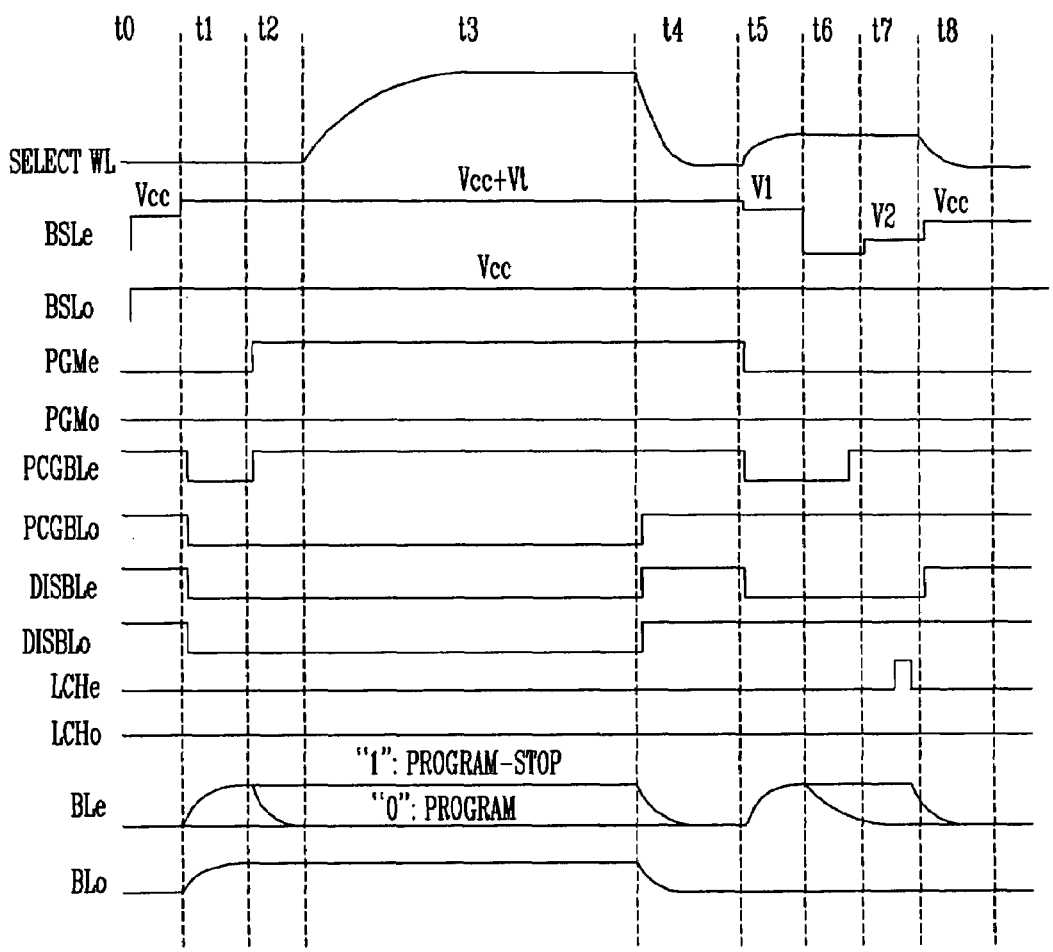
FIG. 6 is a timing diagram showing a method of programming and verifying even cells or odd cells within one page in FIG. 3.

FIG. 6 is a view illustrating a method of programming data into only the even memory cell MC1 (or the odd memory cell MC1') of the memory cells connected to one word line (e.g., WL1), and verifying them.

In conventional techniques, the level of VCC has been applied to non-selected bit lines through VIRPWR. In the present invention, however, the level of VCC is applied to non-selected bit lines using the precharge signals PCGBLe, PCGBLo shown in FIG. 6. As a result, in the present invention, lines to which VIRPWR is applied and transistors to which VIRPWR is applied do not exist.

As shown in FIG. 6, in the case where non-selected bit lines are odd bit lines BLo, the odd bit line select signal BSLo maintains the level of VCC during the program and verify operations. The precharge signal PCGBLo becomes logic low only from the time period t1 to the time period t3, in which program continues, thus turning on the PMOS transistor P12. Therefore, the odd bit line BLo is precharged with the level of VCC. The odd bit line BLo of the precharge state serves as a shielding bit line.

By doing so, the odd page buffer PBo does not operate, but only the even page buffer PBe operate, thus performing the program and verify operations. Detailed description thereof will be omitted since it can be sufficiently understood with referring to the operation of the even register shown in FIG. 5.

Figure 7A:
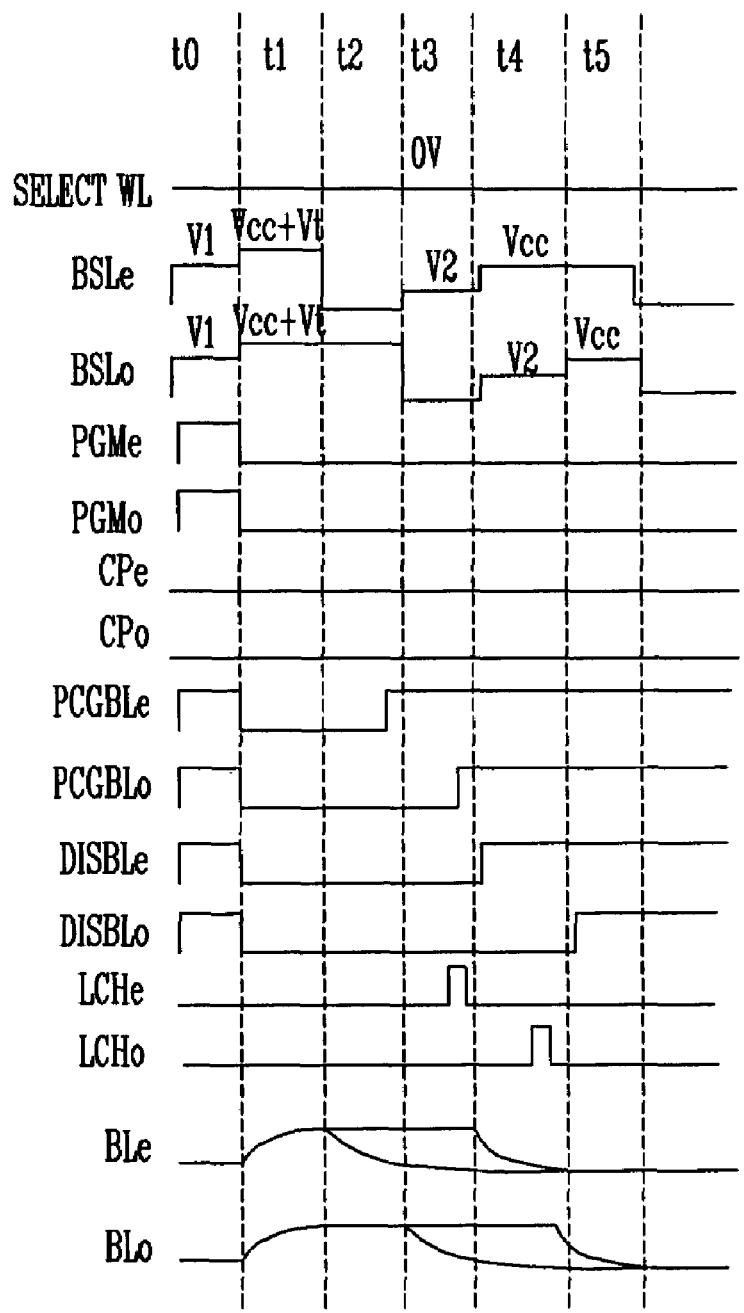
FIGS. 7a and 7b is a timing diagram showing a method of copyback programming even cells and odd cells within one page in FIG. 3.
Figure 7B:
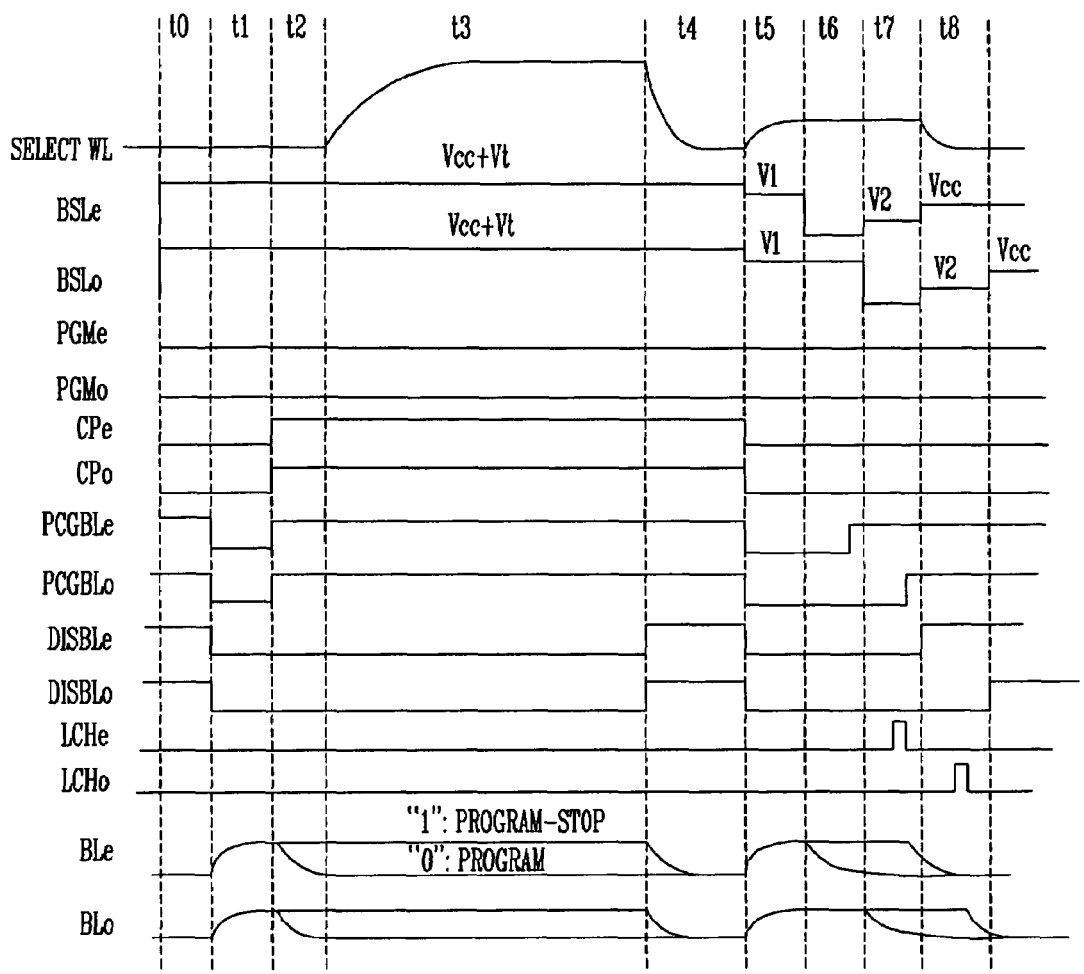

FIGS. 7a and 7b are a method of reading (FIG. 7a) and copyback programming (FIG. 7b) data stored in even memory cells and odd memory cells within one page selected by one word line at the same time.

Hereinafter, a copyback read operation will be described with reference to FIG. 7a.

In a time period to, the discharge signals DISBLe, DISBLo and the program signals PGMe, PGMo become logic high. If so, as the NMOS transistors N11, N13 are turned on, the node QA of the latch circuit LT1 is initialized as "0" and the node QAb thereof is initialized "1". Further, as the NMOS transistors N21, N23 are turned on, the node QB of the latch circuit LT2 is initialized as "0" and the node QBb is initialized "1".

In a time period t1, the bit line select signals BSLe, BSLo become VCC+Vt and the NMOS transistors N31, N32 are all turned on. Thus, the sensing lines SOe, SOo and the bit lines BLe, BLo are connected together. At this time, the precharge signals PCGBLe, PCGBLo become logic low to turn on the PMOS transistors P11, P12 at the same time. Thus, the sensing lines SOe, SOo and the bit lines BLe, BLo are precharged with VCC.

In a time period t2, the bit line select signal BSLe shifts to logic low to turn off the NMOS transistor N31. Thus, data stored in the even memory cells MC1 connected to one word line (e.g., WL1) are read. At this time, if data are programmed into the even memory cells MC1, the even bit line BLe keeps a precharge state. If the even memory cells MC1 are not programmed, the even bit line BLe is discharged. In this period, the odd bit line select signal BSLO continues to keep the voltage VCC. This odd bit line BLo serves as a shielding bit line during the time period t2 where the even bit line BLe performs the read operation, thus removing voltage shift due to coupling between bit lines.

In a time period t3, the even bit line select signal BSLe is applied with the voltage V2 and the latch signal LCHe becomes logic high, so that a read result is stored in the latch circuit LT1. That is, if programmed data are stored in the even memory cells (e.g., MC1), the NMOS transistors N14, N15 are all turned on since the sensing line SOe and the bit lines BLe are precharged, so that "0" is stored in the node QAb of the latch circuit LT1. If data are not programmed in the even memory cells (e.g., MC1), the NMOS transistor N14 is turned off since the sensing line SOe and the bit lines BLe are discharged, so that the node QAb of the latch circuit LT1 is kept to "1" and the node QA thereof is kept to an initial state, i.e., "0". Further, in this period, the odd bit line select signal BSLo becomes logic low and the NMOS transistor N32 is turned off. Thus, data stored in the odd memory cells MC1' connected to one word line (e.g., WL1) are read. At this time, if data are programmed in the odd memory cells MC1', the odd bit line BLo keeps a precharge state. If data are not programmed into the odd memory cells MC1', the odd bit line BLo is discharged. The even bit lines BLe that have already been sensed serve as a shielding bit line during the time period t3 where the odd bit line BLo performs the read operation, removing voltage shift due to coupling between bit lines.

In a time period t4, as the odd bit line select signal BSLo is applied with the voltage V2 and the latch signal LCHo becomes logic high, a read result is store din the latch circuit LT2. That is, if data are programmed into the odd memory cells (e.g., MC1'), the NMOS transistors N24, N25 are turned on since the sensing line SOo and the bit lines BLo are precharged. Thus, data "0" are stored in the node QBb of the latch circuit LT2 and data "1" are stored in the node QB thereof. If data are not programmed into the odd memory cell MC1', the NMOS transistor N24 is turned off since the sensing line SOo and the bit lines BLo are discharged. Thus, the node QBb of the latch circuit LT2 is kept to "1" and the node QB thereof is kept to an initial state, i.e., "0".

In a time period t5, as both the bit line select signals BSLe, BSLo become VCC and the NMOS transistors N31, N32 are turned on, the bit lines BLe, BLo and the sensing lines SOe, SOo are connected. After the time period t5, both the bit line select signals BSLe, BSLo become logic low to turn off the NMOS transistors N31, N32. Thus, the bit lines BLe, BLo and the sensing lines SOe, SOo are not connected.

The method of copyback programming data stored in the latch circuits LT1, LT2 by means of the copyback read operation as shown in FIG. 7a will be described below with reference to FIG. 7b. The term "copyback" refers to that data stored in cells having problems are read from a page buffer and then reprogrammed into other safe cells.

In a time period t0, the bit line select signals BSLe, BSLo become VCC+Vt and both the NMOS transistors N31, N32 are turned on. Thus, the bit lines BLe, BLo are connected to the even page buffer PBe and the odd page buffer PBo through the sensing lines SOe, SOo, respectively.

In a time period t1, the precharge signals PCGBLe, PCGBLo become logic low, and the PMOS transistors P11, P12 are turned on accordingly. Therefore, the sensing lines SOe, SOo and the bit lines BLe, BLo are precharged with the level of VCC.

In a time period t2, as the copyback signals CPe, CPo become logic high, the NMOS transistors N12, N22 are turned on. At this time, if the node QA of the latch circuit LT1 and the node QB of the latch circuit LT2 are "1", the bit line BLe and the odd bit line BLo are kept to a precharge state "1". If the node QA of the latch circuit LT1 and the node QB of the latch circuit LT2 are "0", the bit line BLe and the odd bit line BLo become a discharge state "0".

In a time period t3, if a selected word line (e.g., WL2) is applied with a program voltage, data are programmed into the even memory cells MC2 and the odd memory cells MC2', which are connected to the word line WL2, or programming of data into them is prohibited, according to a voltage of the bit lines BLo, BLe.

Description from a time period t4 to a time period t8 is the same as the program verify operation, which has been described with reference to FIG. 5.

Next, if it is desired to read data stored in a memory cell, the data I/O signals YADe, YADo become logic high and the NMOS transistors N16 and N17, and N26 and N27 are turned on. In this case, after data are stored in the latch circuits LT1, LT2 by means of the same read operation as the aforementioned copyback read operation, the data stored in the latch circuit LT1 are output to the outside through the line YA and the line YAb by means of the data I/O signal YADe. Thereafter, the data stored in the latch circuit LT2 are output to the outside through the line YA and the line YAb by means of the data I/O signal YADo. At this time, the sequence in which the data stored in the latch circuits LT1, LT2 can be opposite.

As described above, according to the present invention, in a NAND-type flash memory device, a program operation, a read operation and a copyback program operation can be performed on cells connected to an even bit line and cells connected to an odd bit line within a page selected by one word line at the same time. As a result, a program throughput can be improved twice, while maintaining an existing memory cell array structure and compatibility with existing read, program and copyback program methods.

Although the foregoing description has been made with reference to the embodiments, it is to be understood that changes and modifications of the present invention may be made by those ordinarily skilled in the art without departing from the spirit and scope of the present invention and appended claims.

What is claimed is:

1. A non-volatile memory device, comprising:
   a cell array having memory cells, each memory cell coupled to a word line and a bit line;
   a plurality of even page buffers, each even page buffer coupled to an even bit line of the bit lines via an even sensing line; and
   a plurality of odd page buffers, each odd page buffer coupled to an odd bit line of the bit lines via an odd sensing line,
   wherein the even page buffers and the odd page buffers sequentially receives data to be programmed, and
   wherein the data are programmed at substantially the same time into even memory cells and odd memory cells that are coupled to the same word line.

2. The non-volatile memory device as claimed in claim 1, wherein the cell array comprises a plurality of planes, and each plane includes a plurality of memory cell blocks and the plurality of even and odd page buffers.

3. The non-volatile memory device as claimed in claim 1, wherein the plurality of planes performs a program operation, a read operation, or a copyback program operation at substantially the same time.

4. The non-volatile memory device as claimed in claim 1, wherein each of the plurality of even page buffer includes an even register for storing data for the even bit lines; and a transistor for selectively coupling the even register and the even bit lines.

5. The non-volatile memory device as claimed in claim 4, wherein the even register comprises:
   a latch circuit to latch data;
   a precharge unit to precharge the even sensing lines;
   a discharge unit to discharge a first node of the latch circuit;
   a data I/O unit coupled to the latch circuit to input and output data;
   a program unit to program data of the first node of the latch circuit into the memory cells; and
   a copyback program unit to copyback program data of a second node of the latch circuit into the memory cells.

6. The non-volatile memory device as claimed in claim 5, wherein the even register further includes a reset unit to initialize the latch circuit and make each of the even bit lines as a shielding bit line in a read operation.

7. The non-volatile memory device as claimed in claim 1, wherein each of the plurality of odd page buffers includes an odd register for storing data for the odd bit lines, and a transistor for selectively coupling the odd register and one of the odd bit lines.

8. The non-volatile memory device as claimed in claim 7, wherein the odd register comprises:
   a latch circuit to latch data;
   a precharge unit to precharge the even sensing lines;
   a discharge unit to discharge a first node of the latch circuit;
   a data I/O unit connected to the latch circuit to input and output data;
   a program unit to program data of the first node of the latch circuit into the memory cells; and
   a copyback program unit to copyback program data of a second node of the latch circuit into the memory cells.

9. The non-volatile memory device as claimed in claim 7, wherein the odd register further includes a reset unit to initialize the latch circuit and make each of the even bit lines as a shielding bit line, in a read operation.

10. A multi-page program method for a non-volatile memory device having a cell array including memory cells coupled to word lines and bit lines, the method:
    sequentially storing data to be programmed in a plurality of even page buffers respectively coupled to even bit lines of the bit lines through even sensing lines, and a plurality of odd page buffers respectively coupled to odd bit lines of the bit lines through the odd sensing lines that are separated from the even sensing lines, the even page buffers storing first data and the odd page buffers storing second data; and
    programming at substantially the same time the first and second data stored in the even and odd page buffers, respectively, into even memory cells and odd memory cells coupled to the same word line.

11. A multi-page read method for a non-volatile memory device having a cell array including memory cells respectively coupled to word lines and bit lines, the method comprising:
    precharging odd bit lines to make the odd bit lines to function as shielding bit lines;
    reading first data programmed into even memory cells coupled to a given word line and storing the first data into a plurality of even page buffers;
    precharging even bit lines to make the even bit lines to function as shielding bit lines;
    reading second data programmed into odd memory cells connected to the given word line and storing the second data in a plurality of odd page buffers; and
    sequentially reading and outputting the first and second data stored in each of the plurality of even and odd page buffers.

12. The multi-page read method as claimed in claim 11, wherein in order to make the odd bit line to function as the shielding bit lines, each of the odd sensing lines and the odd bit lines is precharged using each of the odd page buffers.

13. The multi-page read method as claimed in claim 11, wherein in order to make the even bit line to function as the shielding bit lines, each of the even sensing lines and the even bit lines is precharged using each of the even page buffers.

14. A multi-page copyback program method for a non-volatile memory device having a cell array including memory cells respectively coupled to word lines and bit lines, the method comprising:

precharging a plurality of odd bit lines of the bit lines to make the odd bit lines into shielding bit lines;

reading first data programmed into even memory cells coupled to a first word line of the word lines and storing the first data in a plurality of even page buffers respectively coupled to even bit lines of the bit lines via even sensing lines;

precharging the even bit lines to make the even bit lines into shielding bit lines;

reading second data programmed into odd memory cells coupled to the first word line and storing the second data in a plurality of odd page buffers respectively coupled to the odd bit line via odd sensing lines separated from the even sensing lines; and copyback programming the first data stored in the plurality of even page buffers and the second data stored in the plurality of odd page buffers into even memory cells and odd memory cells coupled to a second word line of the word lines.

15. The multi-page read method as claimed in claim 14, wherein in order to make the odd bit line into the shielding bit lines, the odd sensing lines and the odd bit lines are precharged using the odd page buffers.

16. The multi-page read method as claimed in claim 14, wherein in order to make the even bit line into the shielding bit lines, the even sensing lines and the even bit lines are precharged using the even page buffers.

* * * * *